US009565489B2

(12) United States Patent
Lee et al.

(10) Patent No.: US 9,565,489 B2
(45) Date of Patent: Feb. 7, 2017

(54) DISPLAY DEVICE

(71) Applicant: Samsung Display Co., Ltd., Yongin, Gyeonggi-Do (KR)

(72) Inventors: Tae Hee Lee, Gumi-si (KR); Yi Joon Ahn, Seoul (KR); Yong Suk Yeo, Seongnam-si (KR)

(73) Assignee: Samsung Display Co., Ltd., Samsung-ro, Giheung-Gu, Yongin-si, Gyeonggi-Do (KR)

( * ) Notice: Subject to any disclaimer, the term of this patent is extended or adjusted under 35 U.S.C. 154(b) by 112 days.

(21) Appl. No.: 14/597,430

(22) Filed: Jan. 15, 2015

(65) Prior Publication Data

US 2016/0050472 A1 Feb. 18, 2016

(30) Foreign Application Priority Data

Aug. 18, 2014 (KR) .................. 10-2014-0106986

(51) Int. Cl.
*H04R 1/02* (2006.01)
*H04R 7/04* (2006.01)
*H01L 51/52* (2006.01)
*H04R 17/00* (2006.01)

(52) U.S. Cl.
CPC .............. *H04R 1/028* (2013.01); *H04R 7/045* (2013.01); *H01L 51/5237* (2013.01); *H04R 17/00* (2013.01); *H04R 2499/15* (2013.01)

(58) Field of Classification Search
CPC . H04R 1/028; H01L 51/5237; G02F 1/133308
USPC ............... 257/98; 345/173, 177; 361/679.01, 361/679.23; 362/19; 381/306, 333; 711/154; 726/1; 57/98; 73/606; 347/46; 600/467
See application file for complete search history.

(56) References Cited

U.S. PATENT DOCUMENTS

| 5,211,059 A * | 5/1993 | Hayakawa .......... G01S 15/8906 73/606 |
| 5,339,101 A * | 8/1994 | Rawson ............... B41J 2/14008 347/46 |
| 2003/0128503 A1* | 7/2003 | Takahashi .............. H04N 5/642 361/679.23 |
| 2006/0280327 A1 | 12/2006 | Nakagawa |
| 2006/0280328 A1 | 12/2006 | Nakagawa |
| 2006/0280329 A1 | 12/2006 | Soga |
| 2007/0133158 A1* | 6/2007 | Oda ........................ H04N 5/64 361/679.23 |
| 2008/0175416 A1 | 7/2008 | Suzuki et al. |
| 2009/0261369 A1* | 10/2009 | Komori ............... H01L 27/1214 257/98 |

(Continued)

FOREIGN PATENT DOCUMENTS

| JP | 2007-096722 A | 4/2007 |
| KR | 10-2013-0142653 A | 12/2013 |
| WO | 2007/060768 A1 | 5/2007 |

*Primary Examiner* — Gerald Gauthier
(74) *Attorney, Agent, or Firm* — Robert E. Bushnell, Esq.

(57) ABSTRACT

A display device may include a display panel, a bottom chassis configured to accommodate the display panel, and a plurality of speaker units electrically connected to the display panel and configured to output sounds. The bottom chassis may include a plurality of protrusions protruding downward and in which an enclosure is defined, and also may include a groove that is defined between the protrusions, an opening that is defined by the protrusions, or an elastic member configured to couple the protrusions. The respective speaker units may be disposed in respective protrusions.

17 Claims, 9 Drawing Sheets

(56) References Cited

U.S. PATENT DOCUMENTS

| | | | |
|---|---|---|---|
| 2010/0290650 A1 | 11/2010 | Ogura et al. | |
| 2011/0085684 A1 | 4/2011 | Kim et al. | |
| 2011/0128245 A1 | 6/2011 | Andoh et al. | |
| 2012/0134519 A1* | 5/2012 | Caldes | H04R 1/02 381/306 |
| 2013/0347058 A1* | 12/2013 | Smith | G06F 21/57 726/1 |
| 2014/0006729 A1* | 1/2014 | Cox | G06F 3/0604 711/154 |
| 2014/0153213 A1* | 6/2014 | Oh | F21V 7/00 362/19 |
| 2014/0160040 A1* | 6/2014 | Kang | H04R 17/005 345/173 |
| 2014/0180128 A1* | 6/2014 | Corl | A61B 8/445 600/467 |
| 2014/0327630 A1* | 11/2014 | Burr | G06F 3/0488 345/173 |
| 2014/0334078 A1* | 11/2014 | Lee | H04M 1/03 361/679.01 |
| 2014/0355805 A1* | 12/2014 | Park | H04N 5/64 381/333 |
| 2015/0185963 A1* | 7/2015 | Lee | G06F 3/0433 345/177 |
| 2016/0050472 A1* | 2/2016 | Lee | H04R 1/028 381/333 |

\* cited by examiner

* 322 : 322a, 322b, 322c
* 323 : 323a, 323b, 323c

DISPLAY DEVICE

CLAIM OF PRIORITY

This application claims priority to and the benefit of Korean Patent Application No. 10-2014-0106986, filed on Aug. 18, 2014, in the Korean Intellectual Property Office, the content of which is incorporated herein in its entirety by reference.

BACKGROUND OF THE INVENTION

Field of the Invention

The present invention relates to a display device capable of outputting sounds in different ranges simultaneously.

Description of the Related Art

A liquid crystal display ("LCD") is a type of flat panel display ("FPD") which is most widely used as a display device. The LCD includes two substrates on which an electric field generating electrode such as a pixel electrode and a common electrode is disposed, and a liquid crystal layer interposed between the two substrates. In the LCD, a voltage is applied to the electric field generating electrode so that liquid crystal molecules of the liquid crystal layer are rearranged, thereby adjusting the amount of transmitted light.

A display device using an organic light emitting diode (OLED) does not require a backlight unit for light emission unlike an LCD, and can be manufactured so as to have a thin film laminated structure, which in turn imparts flexibility, and thus it is drawing attention as not only a flat panel display but also as a flexible panel display.

It is to be understood that this background of the technology section is intended to provide useful background for understanding the technology disclosed herein and, as such, the technology background section may include ideas, concepts or recognitions that were not part of what was known or appreciated by those skilled in the pertinent art prior to corresponding effective filing dates of subject matter disclosed herein.

SUMMARY OF THE INVENTION

Embodiments of the present invention are directed toward a display device capable of outputting sounds in different ranges simultaneously.

According to an embodiment of the present invention, a display device includes a display panel, a bottom chassis configured to accommodate the display panel, and a plurality of speaker units electrically connected to the display panel and configured to output sounds. The bottom chassis may include a plurality of protrusions protruding downward and in which an enclosure is defined, and also may include a groove that is defined between the protrusions. The respective speaker units may be disposed in the protrusions.

The display panel may include a first substrate, a second substrate opposite the first substrate, and a liquid crystal layer between the first and second substrates. In this case, the display device may further include a light guide plate, an optical sheet under the light guide plate, and a backlight unit including a light source on one side of the light guide plate.

The optical sheet may include at least one of a diffusion sheet, a prism sheet, and a protective sheet, and the light source may include at least one light emitting diode (LED).

The display panel may include a substrate, a display layer disposed on the substrate and including an organic light emitting diode (OLED), and a thin film encapsulation layer configured to cover the display layer.

The protrusions may have areas different from each other.

The speaker unit may include a lower electrode, an upper electrode opposite the lower electrode, and a piezoelectric element between the lower and upper electrodes.

The speaker unit may be electrically connected to the display panel, and the piezoelectric element may vibrate in response to voltage applied to the upper and lower electrodes so that the speaker unit may output sounds.

According to another embodiment of the present invention, a display device includes a display panel, a bottom chassis configured to accommodate the display panel, and a plurality of speaker units electrically connected to the display panel and configured to output sounds. The bottom chassis may include a plurality of protrusions protruding downward and in which an enclosure is defined, and also may include an opening that is defined between the protrusions. The respective speaker units may be disposed in the protrusions.

The display panel may include a first substrate, a second substrate opposite the first substrate, and a liquid crystal layer between the first and second substrates. In this case, the display device may further include a light guide plate, an optical sheet under the light guide plate, and a backlight unit including a light source on one side of the light guide plate.

The optical sheet may include at least one of a diffusion sheet, a prism sheet, and a protective sheet, and the light source may include at least one light emitting diode (LED).

The display panel may include a substrate, a display layer disposed on the substrate and comprising an organic light emitting diode (OLED), and a thin film encapsulation layer configured to cover the display layer.

The protrusions may have areas different from each other.

The speaker unit may include a lower electrode, an upper electrode opposite the lower electrode, and a piezoelectric element between the lower and upper electrodes.

The speaker unit may be electrically connected to the display panel, and the piezoelectric element may vibrate in response to voltage applied to the upper and lower electrodes so that the speaker unit may output sounds.

According to yet another embodiment of the present invention, a display device includes a display panel, a bottom chassis configured to accommodate the display panel, and a plurality of speaker units electrically connected to the display panel and configured to output sounds. The bottom chassis may include a plurality of protrusions protruding downward and in which an enclosure is defined, and may also include an elastic member configured to couple the protrusions. The respective speaker units may be disposed in the protrusions.

According to the embodiments of the present invention, a display device is capable of outputting sounds in different ranges at the same time.

The foregoing summary is illustrative only and is not intended to be in any way limiting as to the claims of the invention. In addition to the illustrative aspects, embodiments and features described above, further aspects, embodiments and features will become apparent by reference to the drawings and the following detailed description.

BRIEF DESCRIPTION OF THE DRAWINGS

A more complete appreciation of the invention, and many of the attendant advantages thereof, will be readily apparent as the same becomes better understood by reference to the following detailed description when considered in conjunc

DETAILED DESCRIPTION OF THE INVENTION

Figure 1:
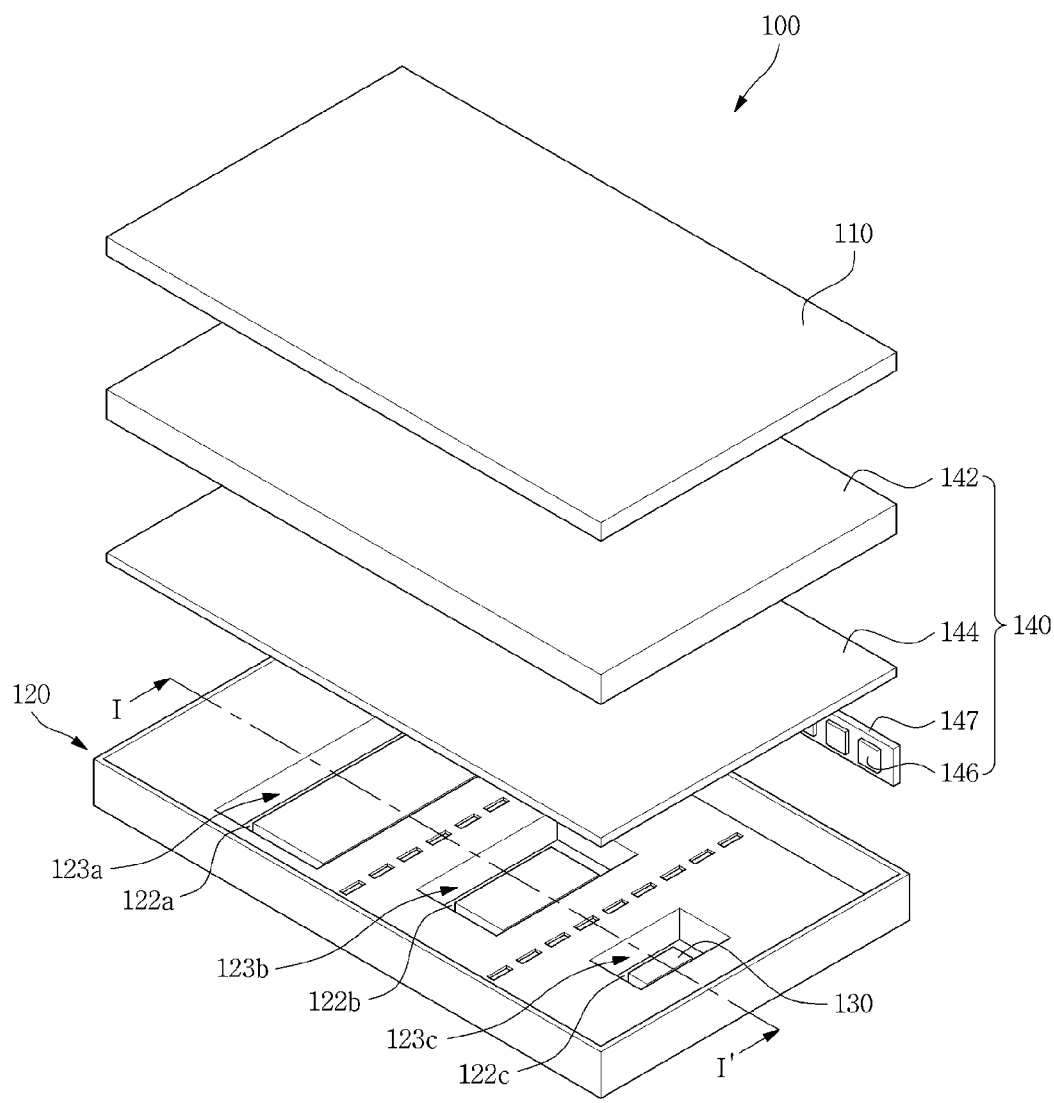
- FIG. 1 is an exploded perspective view illustrating a display device according to an embodiment of the present invention.

Advantages and features of the invention and methods for achieving the same will be made clear from exemplary embodiments described below in detail with reference to the accompanying drawings. The invention may, however, be embodied in many different forms and should not be construed as being limited to the exemplary embodiments set forth herein. Rather, these exemplary embodiments are provided so that this disclosure will be thorough and complete, and will fully convey the scope of the invention to those skilled in the art. The invention is merely defined by the scope of the claims. Therefore, well-known constituent elements, operations and techniques are not described in detail in the exemplary embodiments in order to prevent the invention from being obscurely interpreted Like reference numerals refer to like elements throughout the specification.

The spatially relative terms "lower," "upper" and the like may be used herein for ease of description to describe the relationship between one element or component and another element or component as illustrated in the drawings. It will be understood that the spatially relative terms are intended to encompass different orientations of the device in use or operation, in addition to the orientation depicted in the drawings. For example, in the case where a device shown in the drawing is turned over, the device positioned "below" another device may be placed "above" another device. Accordingly, the illustrative term "lower" may include both lower and upper positions. The device may also be oriented in the other direction, and thus the spatially relative terms may be interpreted differently depending on the orientations.

Throughout the specification, when an element is referred to as being "connected" to another element, the element is "directly connected" to the other element, or it is "electrically connected" to the other element with one or more intervening elements interposed therebetween. It will be further understood that the terms "comprises," "comprising," "includes" and/or "including," when used in this specification, specify the presence of stated features, integers, steps, operations, elements, and/or components, but do not preclude the presence or addition of one or more other features, integers, steps, operations, elements, components, and/or groups thereof.

The terminology used herein is for the purpose of describing particular embodiments only and is not intended to be limiting. As used herein, the singular forms "a," "an," and "the" are intended to include the plural forms, including "at least one," unless the content clearly indicates otherwise. The term "or" means "and/or." As used herein, the term "and/or" includes any and all combinations of one or more of the associated listed items.

Unless otherwise defined, all terms used herein (including technical and scientific terms) have the same meaning as commonly understood by those skilled in the art to which this invention pertains. It will be further understood that terms, such as those defined in commonly used dictionaries, should be interpreted as having a meaning that is consistent with their meaning in the context of the relevant art and will not be interpreted in an ideal or excessively formal sense unless clearly defined in the present specification.

Figure 2:
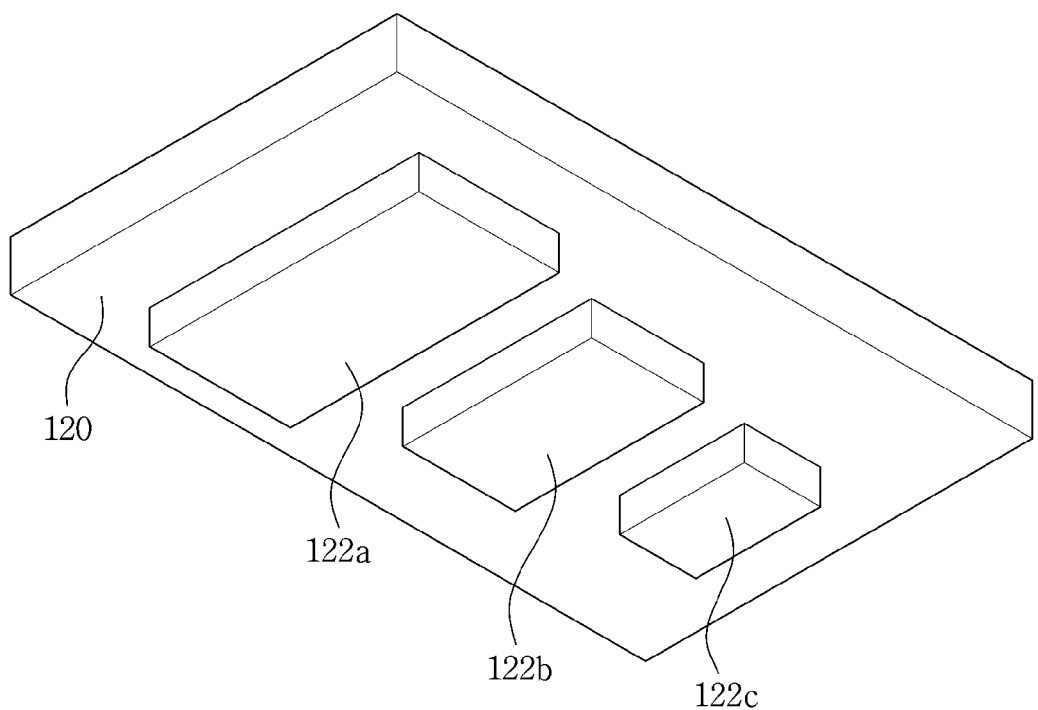
FIG. 2 is a perspective view illustrating a bottom chassis in the display device illustrated in FIG. 1.
Figure 3:
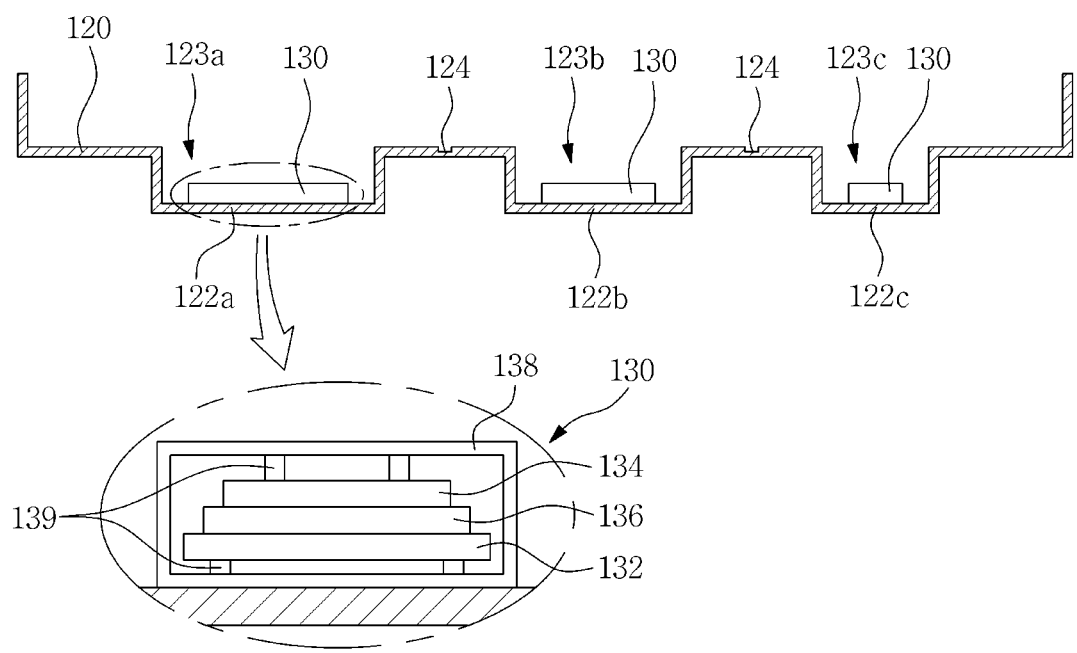
FIG. 3 is a cross-sectional view of the display device illustrated in FIG. 1, taken along line I-I' of FIG. 1.

Referring to FIGS. 1 to 3, a display device 100 according to one embodiment of the present invention includes a display panel 110, a bottom chassis 120 configured to accommodate the display panel 110, and a speaker unit 130 disposed on the bottom chassis 120.

The display panel 110 may be a liquid crystal display panel that includes a first substrate, a second substrate opposite the first substrate, and a liquid crystal layer between the first and second substrates.

The first and second substrates may be a transparent or opaque insulating substrate such as, for example, a silicon substrate, a glass substrate, and a plastic substrate.

The first substrate may include a pixel electrode including a transparent conducting material, a thin film transistor (TFT) configured to apply driving voltage to the pixel electrode, and various signal lines such as gate and data lines configured to drive the pixel electrode and the TFT.

The second substrate may include a common electrode including a transparent conducting material, a color filter, and a black matrix (BM) that covers the gate and data lines, and the TFT.

The pixel and common electrodes may be all disposed only on any one of the first and second substrates, or the color filter and the black matrix BM may be all disposed on the first substrate.

When the display panel 110 is a liquid crystal display panel, the display device 100 may further include a backlight unit 140 between the display panel 110 and the bottom chassis 120.

The backlight unit 140 may include a light guide plate 142, an optical sheet 144 under the light guide plate 142, and a light source 146 on one side of the light guide plate 142.

The light guide plate 142 may equally provide the display panel 110 with light emitted from the light source 146. The light guide plate 142 may include a pattern having a particular shape on its upper or lower surface in order to uniformly supply light. The pattern may be configured in a variety of forms, e.g., oval, polygon, hologram, etc., by using a printing method or an injection molding method.

The light guide plate 142 may include a light-transmissive material, e.g., an acrylic resin such as polymethylmethacrylate ("PMMA") or polycarbonate ("PC"), so as to guide light efficiently.

The optical sheet 144 may diffuse or collimate light received through the light guide plate 142. The optical sheet 144 may include any one of a diffusion sheet, a prism sheet, and a protective sheet.

The optical sheet 144 may desirably have a triple-layer structure in which the diffusion sheet, the prism sheet, and the protective sheet are sequentially disposed, but embodiments of the present invention are not limited thereto. The optical sheet 144 may be suitably changed to have a double-layer structure.

The light source 146 may be disposed on a side of the light guide plate 142 and may emit light to a light incident surface of the light guide plate 142. The light source 146 may include at least one light emitting diode (LED).

The light source 146 may include an LED chip including at least one LED and may be accommodated in a package 147, but embodiments of the present invention are not limited thereto. The light source 146 may include fluorescent lamps such as cold cathode fluorescent lamps (CCFLs) and external electrode fluorescent lamps (EEFLs).

The display panel 110 may include a substrate, a display layer which is disposed on the substrate and includes an organic light emitting diode (OLED), and a thin film encapsulation layer configured to cover the display layer, and thus it may utilize an OLED.

When the display panel 110 uses the OLED, the backlight unit 140 may be omitted.

The bottom chassis 120 may accommodate the display panel 110. When the display device 100 further includes the backlight unit 140, the bottom chassis 120 may further accommodate the backlight unit 140.

The bottom chassis 120 may have a structure in which a bottom surface shaped like a quadrilateral (e.g., rectangle) is coupled to a side surface perpendicular to the bottom surface, but embodiments of the present invention are not limited thereto. The bottom surface and the side surface may be integrally formed and the bottom chassis 120 may have varying shapes depending on the shape of the display panel 110.

The bottom chassis 120 may include a first protrusion 122a, a second protrusion 122b, and a third protrusion 122c, which protrude downward by a predetermined height, and in which enclosures 123a, 123b and 123c, respectively, are defined, and also may have a groove 124 between the first protrusion 122a and the second protrusion 122b and between the second protrusion 122b and the third protrusion 122c (see FIG. 3), but embodiments of the present invention are not limited thereto. The numbers of the protrusions 122 and grooves 124 may be suitably changed when necessary, and furthermore the protrusions 122 may have different protruding heights with respect to each other.

The first, second, and third protrusions 122a, 122b, and 122c, respectively, may be spaced apart from each other and may have different areas with respect to each other. However, the scope of the present invention is not limited to the arrangements of the plurality of protrusions 122. Some of the plurality of protrusions 122 may have the same area and others may have different areas with respect to each other.

In one embodiment, the first protrusion 122a may have a larger area than the second protrusion 122b and the second protrusion 122b may have a larger area than the third protrusion 122c. Accordingly, the first enclosure 123a may have a larger area than the second enclosure 123b and the second enclosure 123b may have a larger area than the third enclosure 123c.

The grooves 124 may have a shape that is cut in the bottom surface of the bottom chassis 120 to a predetermined depth utilizing a half cutting method, but embodiments of the present invention are not limited thereto. The grooves 124 may be defined by various methods.

The grooves 124 may be spaced apart from each other by a predetermined distance and also may be aligned with each other, but embodiments of the present invention are not limited thereto. The grooves 124 may be in the form of being connected in one line.

The speaker units 130 may be disposed inside the first, second, and third protrusions 122a, 122b, and 122c, respectively. The speaker units 130 may have different areas with respect to each other according to areas of the first, second, and third protrusions 122a, 122b, and 122c, respectively.

The speaker unit 130 may include a lower electrode 132, an upper electrode 134 opposite the lower electrode 132, and a piezoelectric element 136 between the lower electrode 132 and the upper electrode 134) see FIG. 3). The speaker unit 130 may further include a housing 138 and a support 139 configured to support the lower and upper electrodes 132 and 134, respectively, in the housing 138.

The piezoelectric element 136 may vibrate in response to voltage applied to the lower and upper electrodes 132 and 134, respectively, from the display panel 110 so that the speaker unit 130 may output sounds. The speaker unit 130 may output sounds in different ranges according to the area of the enclosure 123.

In other words, the speaker unit 130 in the first protrusion 122a may output sounds in a lower range compared to the speaker unit 130 in the second protrusion 122b because the area of the first enclosure 123a defined by the first protrusion 122a is larger than the area of the second enclosure 123b defined by the second protrusion 122b. Also, the speaker unit 130 in the second protrusion 122b may output sounds in a lower range compared to the speaker unit 130 in the third protrusion 122c because the area of the second enclosure 123b defined by the second protrusion 122b is larger than the area of the third enclosure 123c defined by the third protrusion 122c.

According to an embodiment of the present invention, the display device 100 has the grooves 124 defined between the protrusions 122, thereby reducing sound mixture in which sounds in different ranges outputted from the speaker unit 130 overlap each other.

Figure 4:
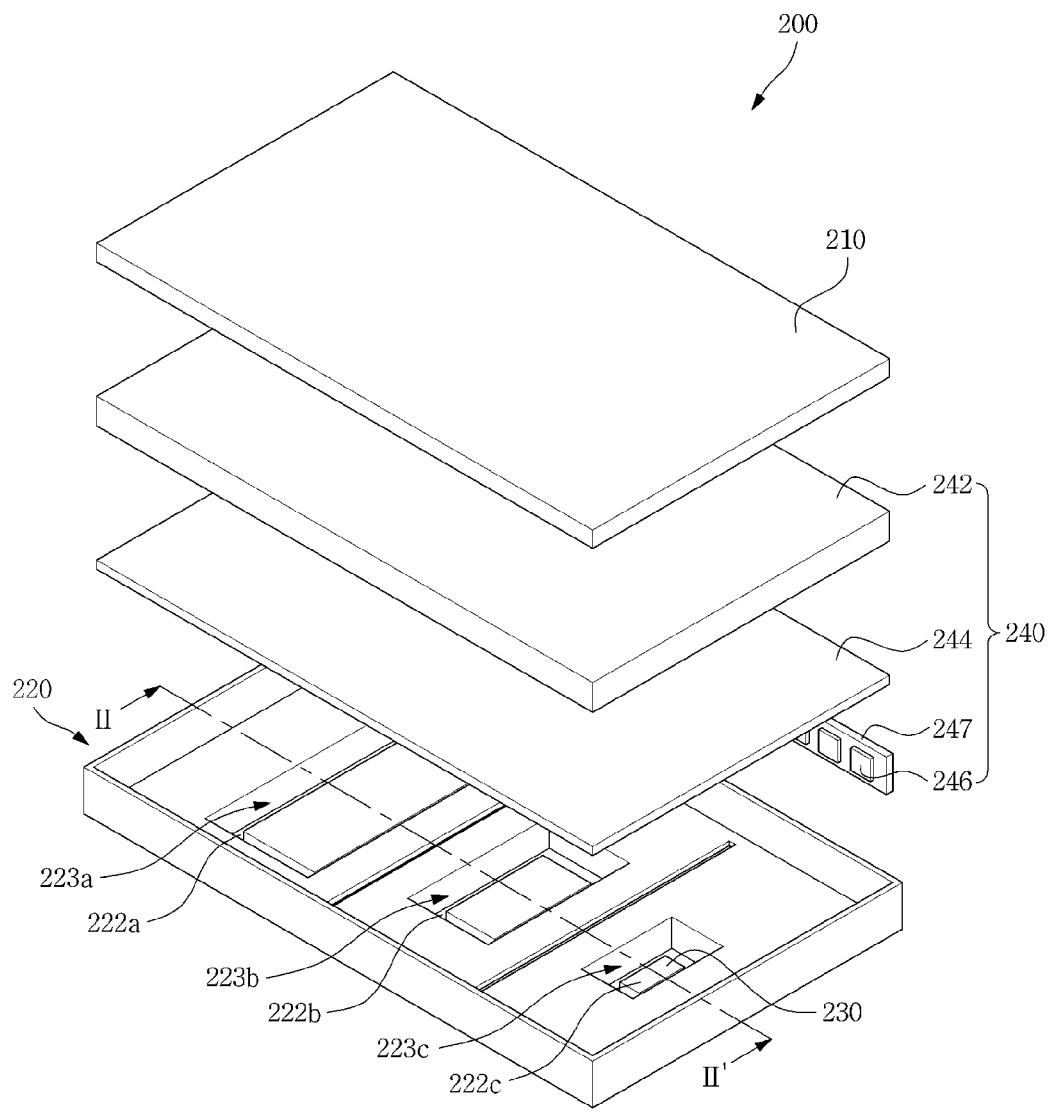
FIG. 4 is an exploded perspective view illustrating a display device according to another embodiment of the present invention.
Figure 5:
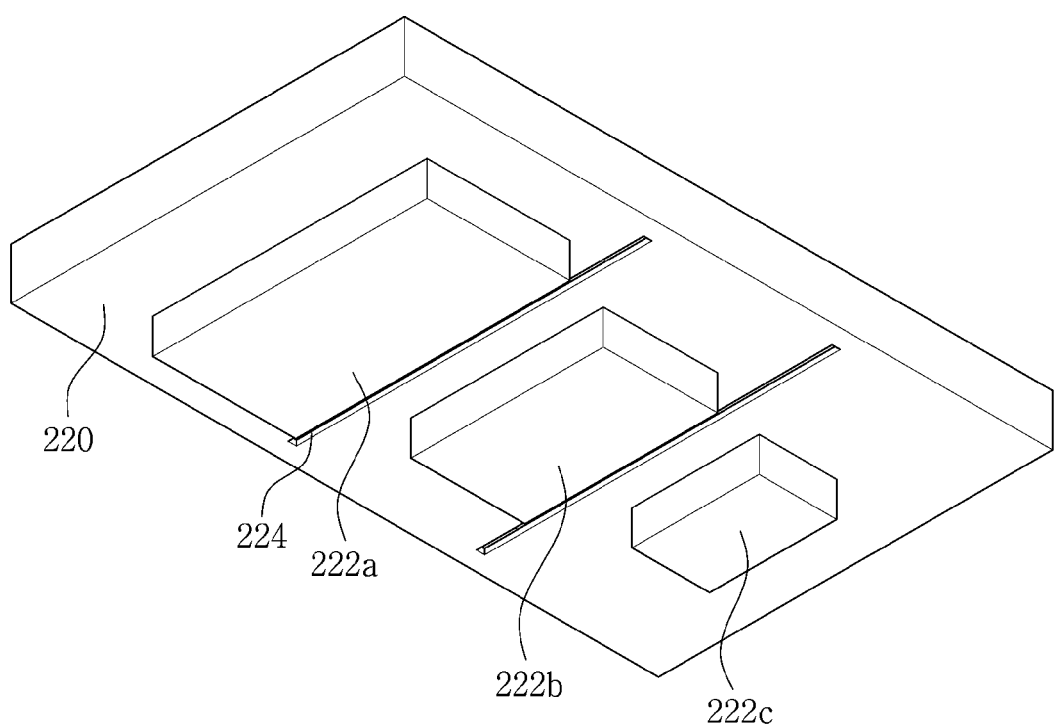
FIG. 5 is a perspective view illustrating a bottom chassis in the display device illustrated in FIG. 4.
Figure 6:
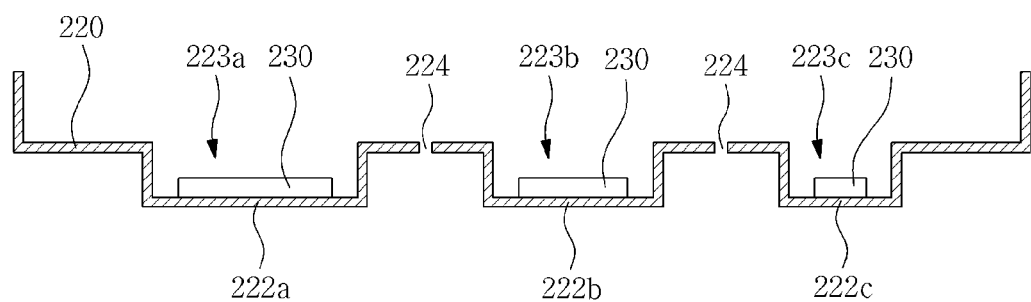
FIG. 6 is a cross-sectional view of the display device illustrated in FIG. 4, taken along line II-II' of FIG. 4.

Referring to FIGS. 4 to 6, a display device 200 according to another embodiment of the present invention has the same configuration as the display device 100 illustrated in FIG. 1 except for the bottom chassis. Therefore, descriptions of the repeated configuration will be omitted for brevity.

A bottom chassis 220 may include a first protrusion 222a, a second protrusion 222b, and a third protrusion 222c, which protrude downwards by a predetermined height, and in which enclosures 223a, 223b and 223c, respectively, are defined, and also may have an opening 224 between the first protrusion 222a and the second protrusion 222b and between the second protrusion 222b and the third protrusion 222c (see FIGS. 5 and 6), but embodiments of the present invention are not limited thereto. The numbers of the protrusions 222 and openings 224 may be suitably changed when necessary.

The opening 224 may have a shape corresponding to its passing through a bottom surface of the bottom chassis 220, or may be a slit shaped like a straight line. However, embodiments of the present invention are not limited thereto, and thus the opening 224 may have various shapes including a curved line.

According to another embodiment of the present invention, the display device 200 has the openings 224 defined between the protrusions 222, thereby reducing sound mixture in which sounds in different ranges outputted from a speaker unit 230 overlap each other.

Figure 7:
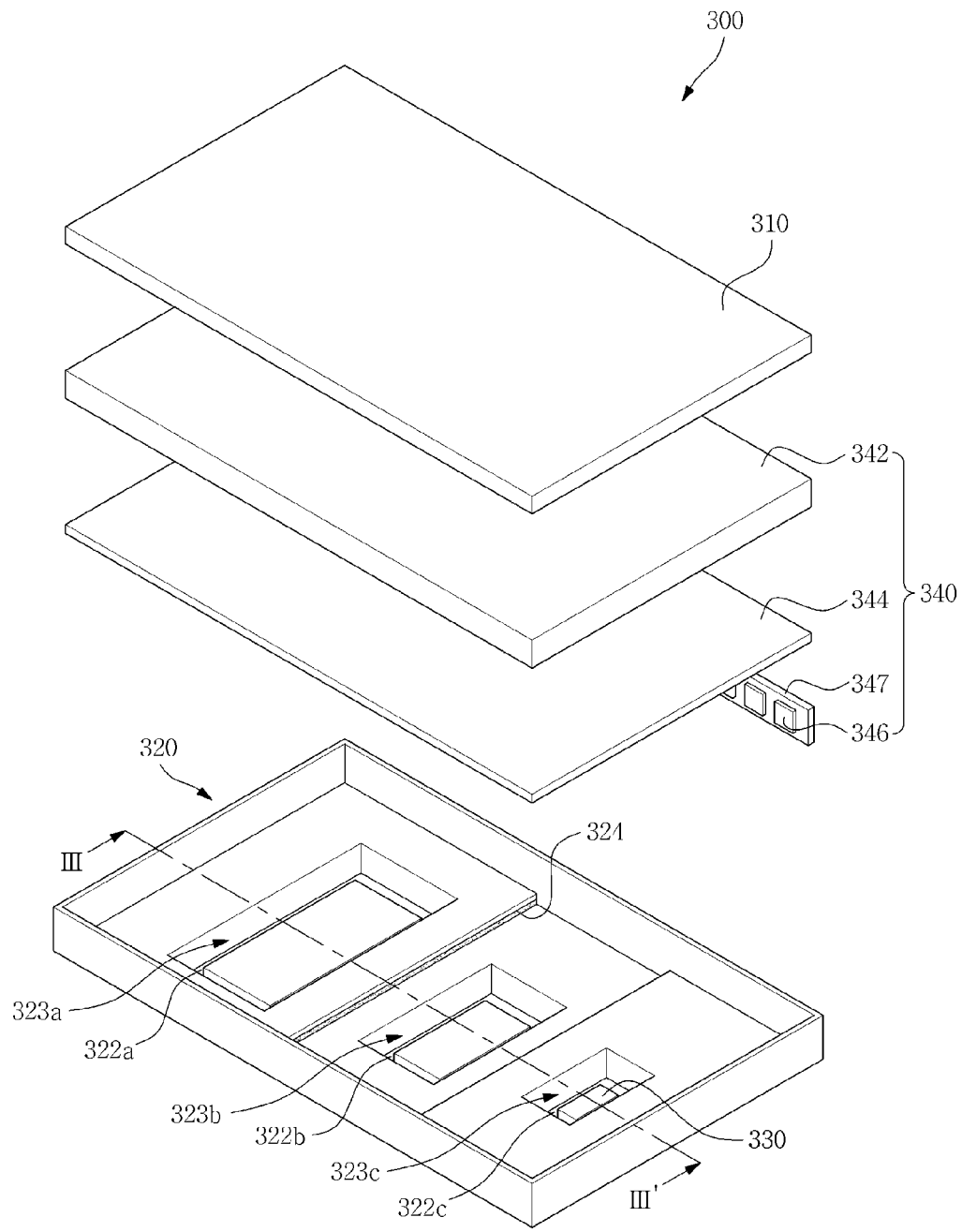
FIG. 7 is an exploded perspective view illustrating a display device according to yet another embodiment of the present invention.
Figure 8:
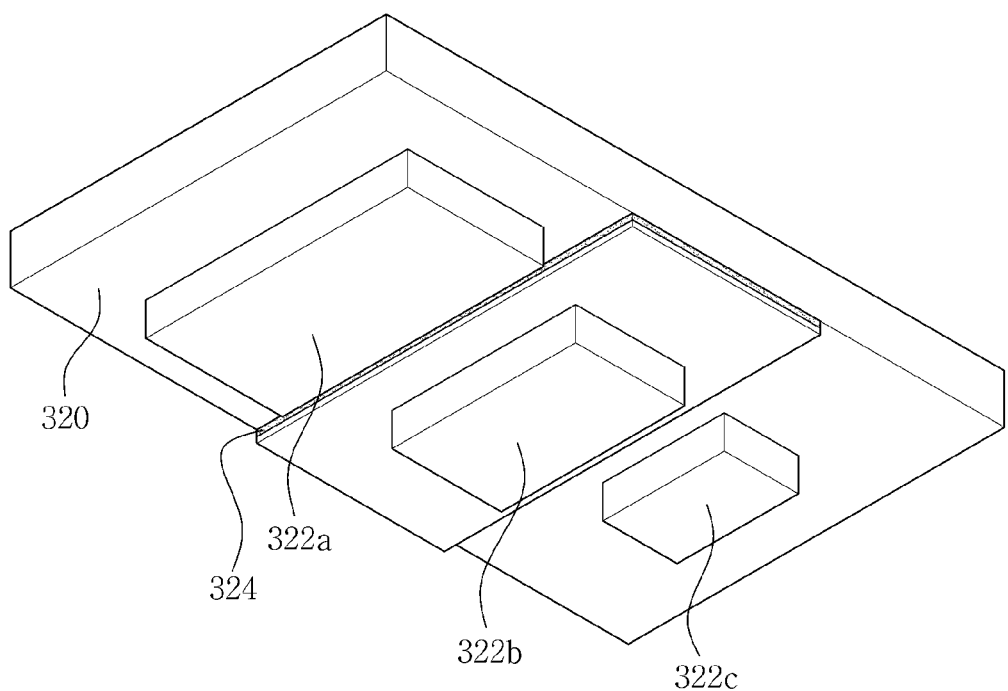
FIG. 8 is a perspective view illustrating a bottom chassis in the display device illustrated in FIG. 7.
Figure 9:
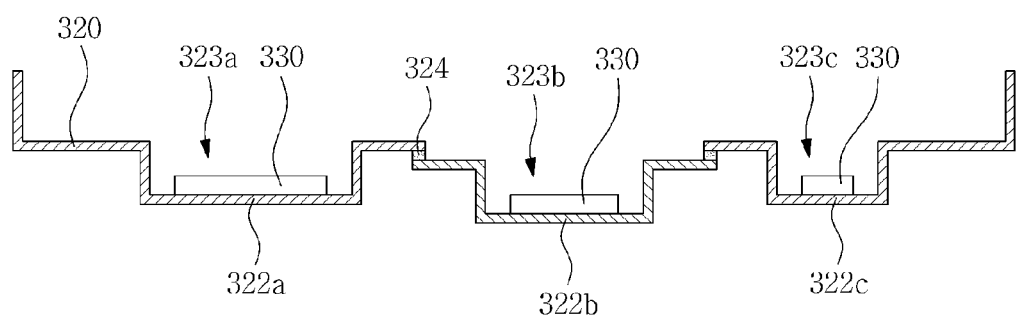
FIG. 9 is a cross-sectional view of the display device illustrated in FIG. 7, taken along line III-III' of FIG. 7.

Referring to FIGS. 7 to 9, a display device 300 according to yet another embodiment of the present invention has the same configuration as the display device 100 illustrated in FIG. 1 except for the bottom chassis. Therefore, descriptions of the repeated configuration will be omitted for brevity.

A bottom chassis 320 may include a first protrusion 322a, a second protrusion 322b, and a third protrusion 322c, which protrude downward by a predetermined height, and in which enclosures 323a, 323b and 323c, respectively, are defined, and also may have a stepped bottom surface between the first protrusion 322a and the second protrusion 322b and between the second protrusion 322b and the third protrusion 322c.

In other words, the second protrusion 322b may further protrude downward compared to the first and third protrusions 322a and 322c, respectively. The second protrusion 322b may be coupled to the first and third protrusions 322a and 322c, respectively, by an elastic member having adhesion and elastic restoring force. Any known elastic member may be used if it is made of a material which imparts adhesion and elastic restoring force.

According to yet another embodiment of the present invention, the display device 300 includes the bottom chassis 320 having the stepped bottom surface between the protrusions 322, thereby reducing sound mixture in which sounds in different ranges output from a speaker unit 330 overlap each other.

From the foregoing, it will be appreciated that various embodiments of the invention have been described herein for purposes of illustration, and that various modifications may be made without departing from the scope and spirit of the present disclosure. Accordingly, the various embodiments disclosed herein are not intended to limit the scope of the invention, and the true scope and spirit of the invention is indicated by the following claims, and equivalents thereof.

What is claimed is:

1. A display device, comprising:
   a display panel;
   a bottom chassis configured to accommodate the display panel; and
   a plurality of speaker units electrically connected to the display panel and configured to output sounds;
   wherein the bottom chassis comprises a plurality of protrusions protruding downward and in which an enclosure is defined, and a groove that is disposed between the protrusions; and
   wherein respective said speaker units are disposed in respective said protrusions, such that each said speaker unit comprises:
   a lower electrode;
   an upper electrode opposite the lower electrode; and
   a piezoelectric element disposed between the lower and upper electrodes.

2. The display device of claim 1, wherein the display panel comprises:
   a first substrate;
   a second substrate opposite the first substrate; and
   a liquid, crystal layer disposed between the first and second substrates.

3. The display device of claim 2, further comprising:
   a light guide plate;
   an optical sheet disposed under the light guide plate; and
   a backlight unit comprising a light source disposed on one side of the light guide plate.

4. The display device of claim 3, wherein the optical sheet comprises at least one of a diffusion sheet, a prism sheet, and a protective sheet; and wherein the light source comprises at least one light emitting diode (LED).

5. The display device of claim 1, wherein the display panel comprises:
   a substrate;
   a display layer disposed on the substrate, the display layer comprising an organic light emitting diode (0LED); and
   a thin film encapsulation layer configured to cover the display layer.

6. The display device of claim 1, wherein the protrusions have different areas with respect to each other.

7. The display device of claim 1, wherein the speaker units are electrically connected to the display panel, and the piezoelectric elements vibrate in response to voltage applied to the upper and lower electrodes so that the speaker units output sounds.

8. A display device, comprising:
   a display panel;
   a bottom chassis configured to accommodate the display panel; and
   a plurality of speaker units electrically connected to the display panel and configured to output sounds;
   wherein the bottom chassis comprises a plurality of protrusions protruding downward and in which an enclosure is defined, and an opening that is disposed between the protrusions; and
   wherein respective said speaker units are disposed in respective said protrusions, such that each said speaker unit comprises:
   a lower electrode;
   an upper electrode disposed opposite the lower electrode; and
   a piezoelectric element disposed between the lower and upper electrodes.

9. The display device of claim 8, wherein the display panel comprises:
   a first substrate;
   a second substrate opposite the first substrate; and
   a liquid crystal layer disposed between the first and second substrates.

10. The display device of claim 9, further comprising:
    a light guide plate;
    an optical sheet disposed under the light guide plate; and
    a backlight unit comprising a light source disposed on one side of the light guide plate.

11. The display device of claim 10. wherein the optical sheet comprises at least one of a diffusion sheet, a prism sheet, and a protective sheet; and wherein the light source comprises at least one light emitting, diode (LED).

12. The display device of claim 8, wherein the display panel comprises:
    a substrate;
    a display layer disposed on the substrate, the display layer comprising an organic light emitting diode (OLED); and
    a thin film encapsulation layer configured to cover the display layer.

13. The display device of claim 8, wherein the protrusions have different areas with respect to each other.

14. The display device of claim 8, wherein the speaker units are electrically connected to the display panel, and the piezoelectric elements vibrate in response to voltage applied to the upper and lower electrodes so that the speaker units output sounds.

15. A display device, comprising:
a display panel;
a bottom chassis configured to accommodate the display panel; and
a plurality of speaker units electrically connected to the display panel and configured to output sounds;
wherein the bottom chassis comprises a plurality of protrusions protruding downward and in which an enclosure is defined, and an elastic member configured to couple the protrusions; and
wherein respective said speaker units are disposed in respective said protrusions, such that each said speaker unit comprises:
a lower electrode:
an upper electrode disposed opposite the lower electrode; and
a piezoelectric element disposed between the lower and upper electrodes.

16. The display device of claim 15, wherein the protrusions have different areas with respect to each other.

17. The display device of claim 15, wherein the speaker units are electrically connected to the display panel, and the piezoelectric elements vibrate in response to voltage applied to the upper and lower electrodes so that the speaker units output sounds.

* * * * *